(12) United States Patent
Jeng

(10) Patent No.: US 7,030,448 B2
(45) Date of Patent: Apr. 18, 2006

(54) MASK ROM AND THE METHOD OF FORMING THE SAME AND THE SCHEME OF READING THE DEVICE

(75) Inventor: Erik S. Jeng, Taipei (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 39 days.

(21) Appl. No.: 10/756,051

(22) Filed: Jan. 12, 2004

(65) Prior Publication Data

US 2005/0156226 A1     Jul. 21, 2005

(51) Int. Cl.
*H01L 29/76* (2006.01)

(52) U.S. Cl. .................. 257/390; 257/275; 257/276; 257/278; 257/315

(58) Field of Classification Search .................. None
See application file for complete search history.

(56) References Cited

U.S. PATENT DOCUMENTS

| 5,486,480 A | * | 1/1996 | Chen | 438/257 |
| 6,468,915 B1 | * | 10/2002 | Liu | 438/706 |
| 2002/0163039 A1 | * | 11/2002 | Clevenger et al. | 257/340 |

\* cited by examiner

*Primary Examiner*—David Nelms
*Assistant Examiner*—Long Tran
(74) *Attorney, Agent, or Firm*—Perkins Coie, LLP

(57) ABSTRACT

The structure of the nonvolatile memory includes a substrate having source/drain formed at unselected sides and source/drain with extension source/drain formed at other selected sides. A gate dielectric layer is formed on the substrate and a gate is formed on the gate dielectric layer. An isolation layer is formed along the surface of the gate. Spacers are formed attached on the sidewalls of the gate.

12 Claims, 3 Drawing Sheets

MASK ROM AND THE METHOD OF FORMING THE SAME AND THE SCHEME OF READING THE DEVICE

TECHNICAL FIELD

The present invention relates to a Mask ROM device capable of storing multi-bits and more specifically, to a method of forming the same and the scheme for reading the data stored therein.

BACKGROUND

A read-only memory (ROM) is a nonvolatile memory where information is permanently stored therein. Among semiconductor memory devices, Mask ROM devices are characterized in that information programmed in a memory cell is not erasable, nor is capable of storing new information in a specific cell. The Mask ROMs with buried bit lines (so called "flat cell") are the most popular types of Mask ROMs. The term "mask" used here is due to a mask is introduced in order to define the digital information. Typically, an ion implantation process is used to adjust the threshold voltage to define the digital state of the memory cell. No dramatic modification is required by the manufacturing process to code (or to program) the digital information into the devices. Conventionally, the buried bit lines are formed by doping impurities into the substrate through a bit line mask. After the MOSFET devices are manufactured, one set of mask is needed for coding purposes. Therefore, the mask ROM device maybe made except the coding procedure prior to the placement of order from the clients. After the confirmation of the order from the clients, the information can be coded into devices according to the coding mask, thereby reducing the turn-around time. The coding of the device can be processed soon after an order is placed to move up the delivery/shipping date.

There are certain limitations in the conventional scheme of the coding procedure. The limitation for the programming types includes:

1. Diffusion programming, the diffusion programming step needs longer turn-around-time due to the coding by diffusion programming is determined prior to the manufacture procedure of the MOSFET devices.

2. Implantation programming, the procedure will be introduced in the middle stage of the manufacturing. The implantation coding is performed right after the formation of the MOSFETS but prior to the backend processes, such as interconnections and metallization. Ions are implanted into the channel region of MOSFETs during the implantation programming to alter their threshold voltages. The turn-around-time of such MASK ROM is shorter, which is accepted by current industries. However, the scheme needs additional mask to achieve the purpose, thereby increasing the cost and making the process becomes complicated.

3. Contact/via programming, in this scheme, a contact/via hole is formed on the source/drain contact nodes of the MOSFETs. Contact/via plugs are provided to connect the source/drain contact nodes of the MOSFETs for determining the on/off status of the MOS. The programming procedure becomes a later step in the scheme, thereby achieving the shortest turn-around-time. However, the scheme needs more layout space for forming the contact/via hole in a dielectric. Therefore, the method will increase the layout area of the cell. It conflicts the scaling-down trend and increases the manufacture cost.

The consideration of the mass production for the MASK ROM is not only the turn-around-time but also the size of the cell device. According to the previous arts, there is a need to further improve the conventional scheme.

One of the prior methods is described in FIGS. 1A–1C. Please refer to FIG. 1A, an isolation 102 is formed in the semiconductor substrate 101 having MOS formed thereon to act memory cell. The memory cell includes gate 103 and source/drain 104. The isolation can be constructed by the STI (shallow trench isolation) or by field oxide using LOCOS procedure. The gate is typically formed of polysilicon, source and drain can be p+ or n+ diffusion regions. In FIG. 1A, the source/drain is n+ diffusion region.

Turing to FIG. 1B, a lithography procedure is introduced with a coding mask to create photo-resist pattern 105 on a portion of the gate 103 and source/drain 104. If the gate of the MOS is exposed by the photo-resist pattern 105, the cell will be defined as digital "one" by subsequent ion implantation into the channel. On the contrary, the cell covered by the pattern 105 will be the digital "zero".

Referring to FIG. 1C, a channel implantation is performed using the photo-resist pattern 105 as a mask to implant dopants into the uncovered cell, thereby coding the digital status in each individual cell, respectively. The following steps includes (a) the formation of isolation such as BPSG formation, (b) metallization, (c) inter-metal dielectric layer formation, (d) via formation and (e) the second metallization, the final passivation and so on.

After the placement of order, the coding mask is manufactured according to the client's coding specifications. Then, the lithography and coding step are subsequently performed to complete the programming in accordance with the specifications of the client. In the conventional scheme, one cell stores one digital status such as "one" or "zero". Thus, the quantity of the information is determined by the number of the MOSFETs.

SUMMARY

The object of the present invention is to disclose a nonvolatile memory with source/drain extension, i.e. lightly doped drain (LDD), structure capable of increasing memory density.

The present invention discloses a method of forming nonvolatile memory, the method comprising:

providing a semiconductor substrate having gate dielectric layer formed thereon, a conductive layer formed on the gate dielectric layer and a first photo-resist pattern formed on the conductive layer;

etching the conductive layer and the gate dielectric to form a gate on the semiconductor substrate using the first photo-resist pattern as an etching mask;

removing the first photo-resist pattern;

patterning a second photo-resist as a coding pattern on the semiconductor substrate to expose portions of the semiconductor substrate;

performing a first ion implantation to implant ions into the portions of the semiconductor substrate to form a first implanted region by using the second photo-resist pattern as an implanting mask for their designated digital states;

removing the second photo-resist pattern;

forming an isolation layer and spacers attached onto sidewalls of the gate;

performing a second ion implantation to implant ions into the semiconductor substrate to form second implanted regions by using the gate and the spacers as an implanting mask.

The gate dielectric layer includes silicon dioxide or the material with dielectric constant around 3–100. The high dielectric constant material (high-k) could be selected from $Ta_2O_5$, $Al_2O_3$, $ZrO_2$, $HfO_2$, $Gd_2O_3$ or $Y_2O_3$. The spacers are formed of the material selected from oxide, nitride, high-k or the combination thereof. The ion source for the first and the second ion implantations is selected from the group consisting phosphorus, arsenic, boron and the combination thereof.

The structure of the nonvolatile memory comprises a substrate having source/drain formed at both sides and source/drain with source/drain extension formed at predetermined sides of the gates. A gate dielectric layer is formed on the substrate and a gate is then formed on the gate dielectric layer. An isolation layer is formed along the surface of the gate. Spacers are formed attached on the sidewalls of the isolation layer. The thickness of the gate is approximately 800–2500 angstroms. The thickness of the gate dielectric layer is approximately 10–250 angstroms and the thickness of the isolation layer is approximately 20–200 angstroms. The width of the spacers is approximately 200–2000 angstroms.

The present invention also provides a method of operating a nonvolatile memory during the reading mode, wherein the nonvolatile memory includes a gate formed on a substrate, the gate having first spacer formed on a first sidewall of the gate and second spacer formed on a second sidewall of the gate, a first source/drain region formed in a first side of the substrate, a second source/drain region formed in a second side of the substrate, an impurity extension region selectively formed adjacent to either the first or second of source/drain regions or both or none depending on their predetermined digital states, the method comprising:

applying a read bias on the gate;

applying a ground bias on the first source/drain and applying a read bias on the second source/drain, thereby causing the current to be read indicating the presence or absence of said impurity extension region located under said first spacer, which is defined as the first digital status;

applying a read bias on said first source/drain and applying a ground bias on said second source/drain thereby causing the current to be read indicating the presence or absence of said impurity extension region located under said second spacer, which is defined as the second digital status. The read bias is higher or lower than the ground bias.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method, structure for nonvolatile memory. In the structure, the cell capacity for storing data can be increased by the cell structure. The detail description will be seen as follows.

Figure 1A:
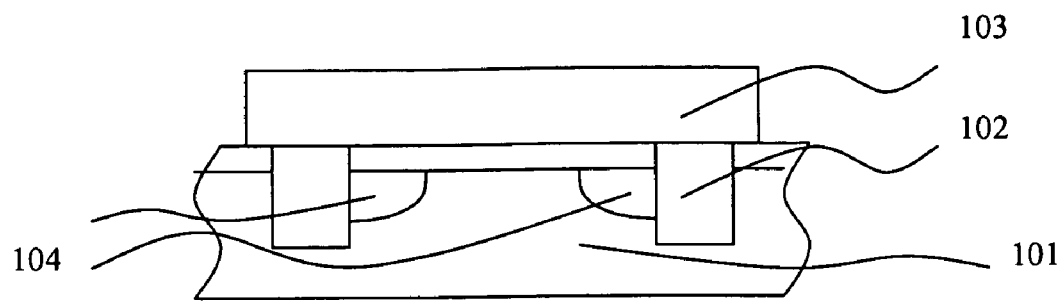
FIG. 1a-1c are cross sectional views of semiconductor wafer illustrating the example according to the prior art.
Figure 1B:
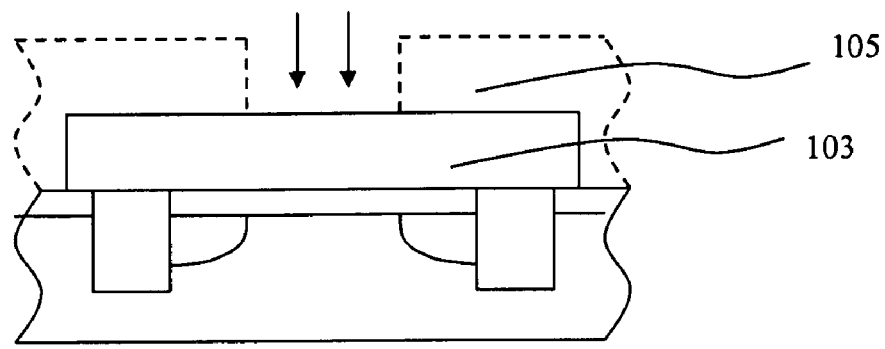
Figure 1C:
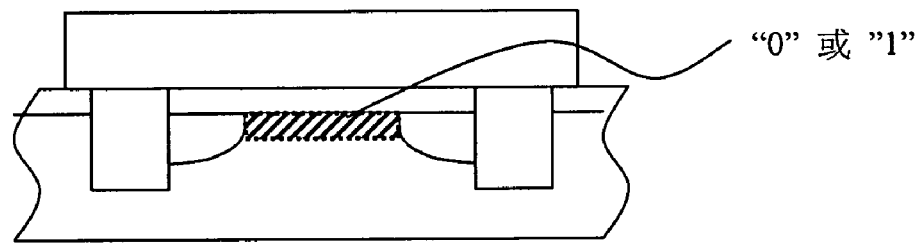
Figure 2A:
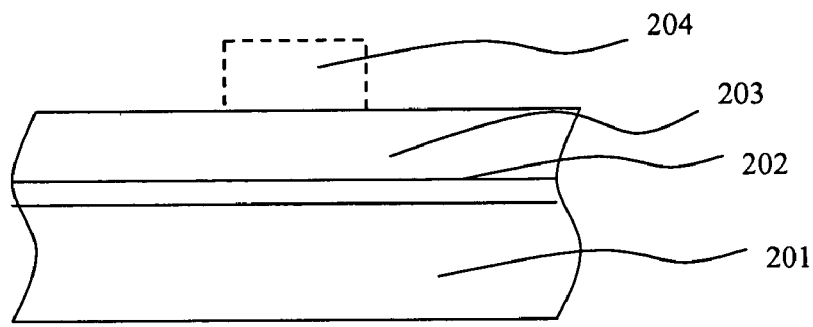
FIG. 2a-2h are cross sectional views of semiconductor wafer illustrating the embodiment according to the present invention.

Please refer to FIG. 2A, a semiconductor substrate is provided for the present invention. In a preferred embodiment, as shown in the FIG. 2A, a single crystal silicon substrate 201 with a <100> or <111> crystallographic orientation is provided. The substrate 201 includes the isolation to separate the devices. A thin dielectric layer 202 consisted of silicon dioxide or high k material is formed on the substrate 201 to act as a gate oxide. Typically, the oxide layer 202 can be grown in oxygen ambient at a temperature of about 700 to 1100 degrees centigrade. Other methods, such as chemical vapor deposition, can also form the oxide layer. The high-k dielectric with dielectric constant about 3–100 can be one of $Ta_2O_5$, $Al_2O_3$, $ZrO_2$, $HfO_2$, $Gd_2O_3$ or $Y_2O_3$. In the embodiment, thickness of the dielectric layer 202 is approximately 15–250 angstroms. Subsequently, a conductive layer 203 is formed on the gate oxide layer 202. The conductive layer 203 can be formed of doped polysilicon, in-situ doped polysilicon or epitaxy silicon. For an embodiment, the doped polysilicon layer 203 is doped by phosphorus using a $PH_3$ source. The thickness of the dielectric layer 202 is approximately 800–2500 angstroms.

Figure 2B:
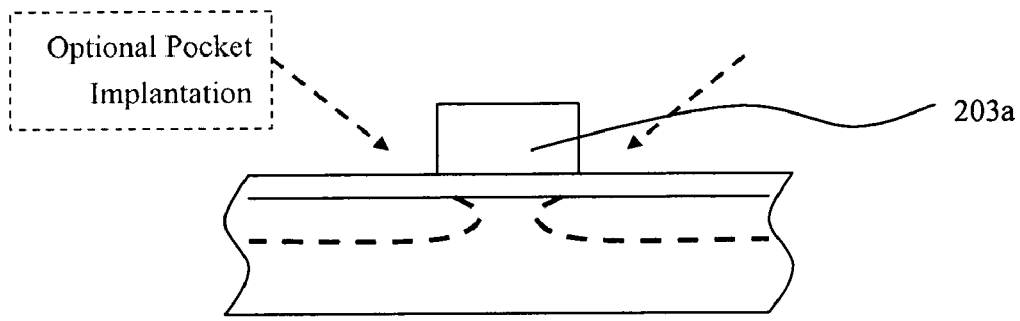

As shown in FIG. 2B, a photo-resist pattern 204 is formed on the conductive layer 203 to act as the etching mask for etching the conductive layer 203 to create the gate structure, followed by stripping the photo-resist pattern 204. An optional pocket ion implantation may be performed after the formation of the gate structure 203a. Therefore, a pocket ion implantation region is formed adjacent to the gate after the removal of the photoresist. The conductive type of the pocket ion implantation region is opposite to the one of the source/drain.

Figure 2C:
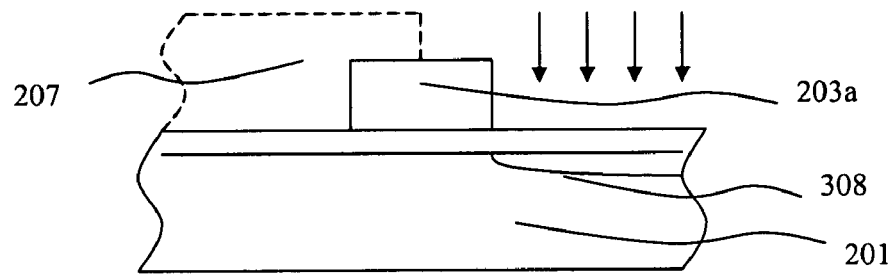
Figure 2D:
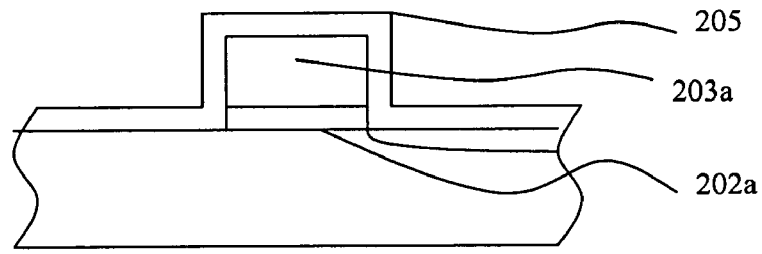

Refer to FIG. 2C, a second photo-resist pattern 207 is formed to expose a portion of the substrate 201. A ion implantation is subsequently performed by using the gate structure 203a and the second photo-resist pattern 207 as mask to implant impurities into the substrate to form a source/drain extension 308 located at selective sides of the gate structure 203a as predetermined digital states.

Figure 2E:
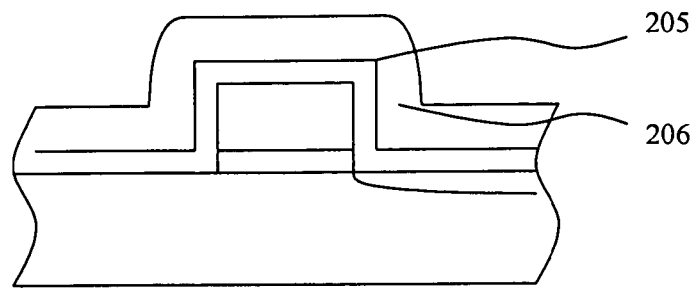
Figure 2F:
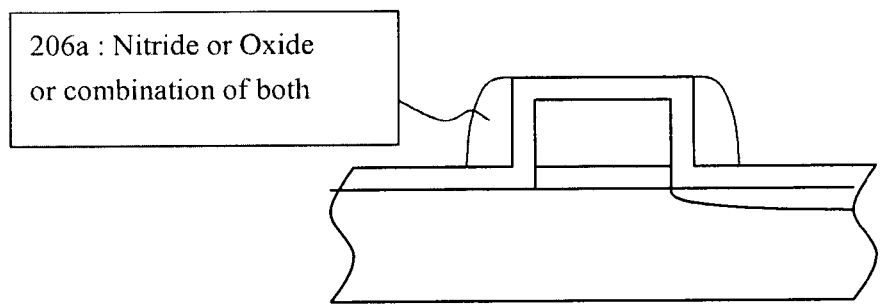

After the removal of the second photo-resist pattern 207, the dielectric 202 that is exposed by the gate structure 203a is removed by dry or wet etching to leave residual gate dielectric under the gate structure 203a. A conformal isolation layer 205 is then conformally formed on the surface of the gate structure 203a and the substrate. Oxide or nitride can be used as the isolation layer 205. The thickness of the isolation layer 205 is approximately 20–200 angstroms. Next, a further isolation layer 206 is deposited on the isolation layer 205. The isolation layer 206 could be oxide or nitride or the combination of oxide and nitride, as shown in FIG. 2E.

Subsequently, an anisotropic etching is employed to etch the isolation layer 206 to form spacers 206a on the sidewall of the isolation structure 205. The spacer is therefore formed of oxide, nitride or the combination thereof. The anisotropic etching includes reactive ion etching or plasma etching.

Figure 2G:
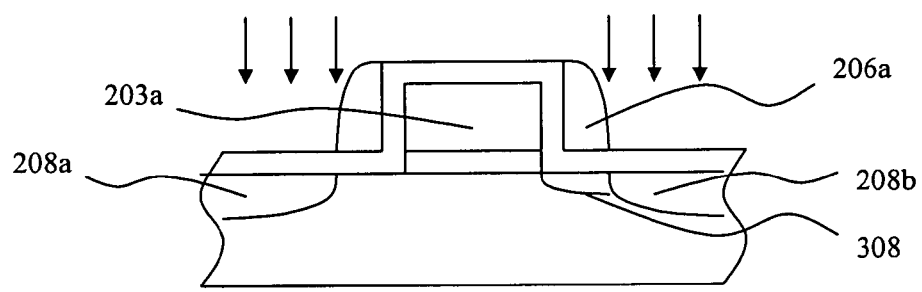

Thereafter, an ion implantation is introduced to implant ions into the substrate by using the spacers 206a and gate structure 203a as an implanting mask, thereby creating source/drain regions 208a, 208b in the substrate as shown in FIG. 2G. Wherein the ion source for the implantation can be P, (phosphorous), As (arsenic) or B (boron). One aspect of the present invention is that selected sides of the gate structure 203a include source/drain extension 308 located at aside of the gate structure 203a and adjacent to the source/drain 208b. Thus, the source/drain extension 308 is formed between the gate structure 203a and the source/drain 208b. The other unselected sides of the gate structure 203a include source/drain 208a, and there is substantially no source/drain extension 308. Since the source/drain extension 308 is formed adjacent to the gate structure 203a, the area will be defined as "digital one" in later steps. The area without source/drain extension 308 will be defined as "digital zero" due to the threshold voltage will be higher than the one with source/drain extension 308 during the reading mode. By controlling the suitable bias applied on the gate structure 203, the source/drain without source/drain extension 308 will not be conducted, only small amount of leakage current or sub-threshold current will be generated, thereby defining the status as "digital zero". On the contrary, under the same bias, the source/drain with source/drain extension 308 will generate current in the source/drain and thereby conducting due to its lower threshold voltage. This status could be defined as "digital one".

Figure 2H:
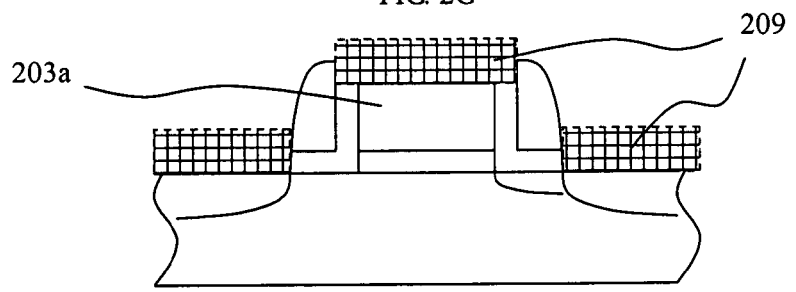

Please refer to FIG. 2H, the exposed portion of the isolation layer 205 is removed, the gate structure 203a and portions of the substrate 201 are exposed. Silicide 209 is introduced on the exposed surface of the top portion of gate 203a and the silicon substrate 201 on the source/drain regions 208a, 208b to reduce their resistance by self-aligned silicide process (SALICIDE). Preferably, the silicide 209 can be $TiSi_2$, $WSi_2$, $CoSi_2$ or NiSi.

The digital status can be defined as "zero" or "one" by introducing the source/drain extension 308 or not under the spacer 206a and between the S/D and gate 203a. Therefore, there are two bits can be stored by one MOS transistor cell to increase the capacity of information stored in the cell. Further, the width of the area for defining the digital status is substantially the same with or narrower than the width of the spacer 206a. The pitch or space of two neighboring MOS cell will not be changed. Hence, in comparison to the prior art cell, the unit cell area of the present invention will not be enlarged. According to above discussion, the digital status is defined according to whether there is S/D extension under the spacer or not. The capacity of the memory can be increased without increasing the cell number. For example, the digital information density can be increase two times compared to the scheme with the same cell dimension. Consequently, the manufacture cost can be lowered down.

A method of operating a nonvolatile memory during the reading mode, wherein the nonvolatile memory includes a gate formed on a substrate, the gate having first spacer formed on a first sidewall of the gate and second spacer formed on a second sidewall of the gate, a first source/drain region formed in a first side of the substrate, a second source/drain region formed in a second side of the substrate, an impurity extension region selectively formed adjacent to either the first or second source/drain regions or both or none, the method comprising:

applying a read bias on the gate;

applying a ground bias on the first source/drain and applying a read bias on the second source/drain, thereby cause the current to be read indicating the presence or absence of said impurity extension region located under said first spacer, which is defined as the first digital status, applying a read bias on said first source/drain and applying a ground bias on said second source/drain thereby cause the current to be read indicating the presence or absence of said impurity extension region located under said second spacer, which is defined as the second digital status.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

I claim:

1. A Mask ROM, comprising:
   a substrate having source/drain formed at unselected side and source/drain with extension source/drain formed at other selected side, wherein a "digital zero" area is defined in said source/drain formed at said unselected side, and "digital one" area is defined in said source/drain with extension source/drain;
   gate dielectric layer formed on said substrate;
   gate formed on said gate dielectric layer;
   isolation layer formed along the surface of said gate; and
   spacers formed attached on the sidewalls of said isolation layer.

2. The Mask ROM of claim 1, wherein the thickness of said gate is approximately 800–2500 angstroms.

3. The Mask ROM of claim 1, wherein the thickness of said gate dielectric layer is approximately 10–250 angstroms.

4. The Mask ROM of claim 1, wherein the thickness of said isolation layer is approximately 20–200 angstroms.

5. The Mask ROM of claim 1, wherein the width of said spacer are approximately 200–2000 angstroms.

6. The Mask ROM of claim 1, further comprising silicide on said gate and source/drain regions.

7. The Mask ROM of claim 1, wherein said gate dielectric layer includes oxide or the material with high dielectric constant.

8. The Mask ROM of claim 7, wherein said dielectric constant of said high dielectric constant is around 3–100.

9. The Mask ROM of claim 8, wherein said material with high-k (dielectric constant) is selected from $Ta_2O_5$, $Al_2O_3$, $ZrO_2$, $HfO_2$, $Gd_2O_3$ or $Y_2O_3$.

10. The Mask ROM of claim 1, wherein said spacers are formed of the material selected form oxide, nitride or the combination thereof.

11. The Mask ROM of claim 1, wherein the ion source for said source/drain is selected from the group consisting of phosphorus, arsenic, boron and the combination thereof.

12. The Mask ROM of claim 1, further comprising a pocket ion implantation region formed adjacent to said gate or source/drain, wherein the conductive type of said pocket ion implantation region is opposite to the one of said source/drain.

* * * * *